United States Patent
Gao et al.

(10) Patent No.: US 10,482,835 B2
(45) Date of Patent: Nov. 19, 2019

(54) GATE DRIVING CIRCUIT, GATE DRIVING METHOD, ARRAY SUBSTRATE AND DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Bo Gao, Beijing (CN); Hao Zhang, Beijing (CN); Lingyun Shi, Beijing (CN); Xiurong Wang, Beijing (CN); Xue Dong, Beijing (CN); Yafei Li, Beijing (CN); Peng Han, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/325,975

(22) PCT Filed: Jan. 20, 2016

(86) PCT No.: PCT/CN2016/071458
§ 371 (c)(1),
(2) Date: Jan. 12, 2017

(87) PCT Pub. No.: WO2017/054373
PCT Pub. Date: Apr. 6, 2017

(65) Prior Publication Data
US 2017/0301304 A1  Oct. 19, 2017

(30) Foreign Application Priority Data
Sep. 28, 2015 (CN) .......................... 2015 1 0627476

(51) Int. Cl.
*G09G 3/36* (2006.01)
*G11C 19/28* (2006.01)

(52) U.S. Cl.
CPC .......... *G09G 3/3677* (2013.01); *G09G 3/3648* (2013.01); *G11C 19/28* (2013.01);
(Continued)

(58) Field of Classification Search
CPC ............... G09G 3/3677; G09G 3/3648; G09G 2300/0408; G09G 2310/0286; G09G 2310/08; G11C 19/287
See application file for complete search history.

(56) References Cited

U.S. PATENT DOCUMENTS 6,281,891 B1 * 8/2001 DaCosta .............. G09G 3/3611
345/204
2002/0000969 A1  1/2002 Ozawa
(Continued)

FOREIGN PATENT DOCUMENTS

| CN | 1320900 A | 11/2001 |
|---|---|---|
| CN | 202210402 U | 5/2012 |

(Continued)

OTHER PUBLICATIONS

First Office Action with English Translation, dated Mar. 13, 2017, CN Application 201510627476.2.
(Continued)

*Primary Examiner* — Wing H Chow
(74) *Attorney, Agent, or Firm* — Womble Bond Dickinson (US) LLP

(57) ABSTRACT

The present disclosure discloses a gate driving circuit, a gate driving method, an array substrate and a display panel. The gate driving circuit includes a plurality of shift registers cascaded together to successively output a respective drive signal, and a plurality of control switches each configured for connection to a respective one of gate lines. Each of the plurality of shift registers is connected to at least two respective ones of the plurality of control switches to output the respective drive signal to the at least two control
(Continued)

switches. The plurality of control switches are configured such that the control switches connected to the same shift register are turned on and off time-divisionally in response to a control signal, whereby the respective drive signal output by the shift register is coupled to the gate line corresponding to a turned-on one of the control switches.

9 Claims, 3 Drawing Sheets

(52) U.S. Cl.
CPC ...... *G11C 19/287* (2013.01); *G09G 2300/0408* (2013.01); *G09G 2310/0286* (2013.01); *G09G 2310/08* (2013.01)

(56) References Cited

U.S. PATENT DOCUMENTS

2010/0001929 A1  1/2010  Kawabe
2015/0325181 A1*  11/2015  Wang .................. G09G 3/3677
                                                              377/64
2015/0356934 A1*  12/2015  Yamashita ........... G09G 3/3611
                                                              345/205

FOREIGN PATENT DOCUMENTS

| | | |
|---|---|---|
| CN | 102881248 A | 1/2013 |
| CN | 104157248 A | 11/2014 |
| CN | 104835466 A | 8/2015 |
| CN | 105118470 A | 12/2015 |
| JP | 3329009 B2 | 9/2002 |

OTHER PUBLICATIONS

Office Action received for Chinese Patent Application No. 201510627476.2, dated Oct. 18, 2017, 15 pages (9 pages of English Translation and 6 pages of original Document).
International Search Report and Written Opinion in PCT/CN2016/071458 dated Jul. 12, 2016, with English translation. 14 pages.

\* cited by examiner

GATE DRIVING CIRCUIT, GATE DRIVING METHOD, ARRAY SUBSTRATE AND DISPLAY PANEL

RELATED APPLICATIONS

The present application is the U.S. national phase entry of PCT/CN2016/071458, with an international filling date of Jan. 20, 2016, which claims the benefit of Chinese Patent Application NO. 201510627476.2, filed on Sep. 28, 2015, the entire disclosure of which is incorporated herein by reference.

TECHNICAL FIELD

The present disclosure relates to the field of display technologies, and particularly to agate driving circuit, a gate driving method, an array substrate and a display panel.

BACKGROUND

The liquid crystal display device is currently among most extensively-used types of panel display devices. The liquid crystal display device usually includes an array substrate, a color filter substrate and a liquid crystal layer interposed between the two substrates. These two substrates are provided with pixel electrodes and common electrodes for generating an electric field. By applying voltages to the electrodes, the liquid crystal display device generates an electric field in the liquid crystal layer and displays an image. This electric field determines orientation of liquid crystal molecules in the liquid crystal layer and controls polarization of incident light, thereby controlling the luminance of the light that passes through a polarizer on the color filter substrate and achieving different display tones.

The liquid crystal display device usually includes a liquid crystal display panel assembly, a gate driver and a data driver connected to the liquid crystal display panel assembly, a gray-scale voltage generator integrated in the data driver, and a timing controller for controlling the above components. The gate driver is connected to gate lines to apply gate signals formed by combining a gate turn-on voltage and a gate turn-off voltage to the gate lines. The gray-scale voltage generator generates a gray-scale voltage set corresponding to a pixel transmission rate. The data driver is connected to data lines of the liquid crystal display panel, and selects a gray-scale voltage from the gray-scale voltage set of the gray-scale voltage generator as a data signal and applies it to a respective pixel electrode. The timing controller receives image signals R, G and B and input control signals for controlling display from the external. Upon receipt of these input control signals, the timing controller generates and transits a gate control signal and a data control signal to the gate driver and the data driver, respectively.

In recent years, a gate driver on array (GOA) technology emerges for reduced cost where the gate driver is completely fabricated on the array substrate. However, since the gate driving circuit is relatively complicated, problems such as excessive occupation of the footprint of the substrate may be caused if the gate driving circuit is completely fabricated on the array substrate.

SUMMARY

It is an object of the present disclosure to provide a gate driving circuit which may mitigate or alleviate the problem that a gate driver on array (GOA) circuit occupies a large footprint. It is another object of the present disclosure to provide a gate driving method, an array substrate and a display panel.

According to an aspect of the present disclosure, there is provided gate driving circuit which includes a plurality of shift registers cascaded together to successively output a respective drive signal, and a plurality of control switches each configured for connection to a respective one of gate lines. Each of the plurality of shift registers is connected to at least two respective ones of the plurality of control switches to output the respective drive signal to the at least two control switches. The plurality of control switches are configured such that the respective control switches connected to the same shift register are turned on and off time-divisionally in response to a control signal, whereby the respective drive signal output by the shift register is coupled to the gate line corresponding to a turned-on one of the respective control switches.

In an embodiment, each of the plurality of shift registers is connected to an equal number of control switches.

In an embodiment, the plurality of control switches are divided into a plurality of groups, the number of the groups being equal to the number of the control switches to which each of the shift registers is connected. The control switches to which the same shift register is connected belong to respective different groups.

In an embodiment, the plurality of control switches are configured for connection to the gate lines so that the gate lines connected to the control switches belonging to the same group are arranged successively.

In an embodiment, the plurality of control switches are configured for connection to the gate lines so that the gate lines connected to the control switches belonging to different groups are arranged alternatingly.

In an embodiment, each of the plurality of control switches is a thin-film transistor.

In an embodiment, a source of the thin-film transistor is electrically connected with the shift register, a drain of the thin-film transistor is electrically connected with the gate line, and the control signal is provided to a gate of the thin-film transistor.

According to another aspect of the present disclosure, there is provided an array substrate which includes the above-mentioned gate driving circuit.

In an embodiment, the array substrate further includes a data driver which is integrated with the gate driving circuit.

According to a further aspect of the present disclosure, there is provided a display panel which includes the above-mentioned array substrate.

According to a further aspect of the present disclosure, there is provided a method for gate driving using the gate driving circuit as described above, including successively outputting, by the plurality of shift registers, a respective drive signal, and providing a control signal to the plurality of control switches so that the control switches connected to the same shift register are turned on and off time-divisionally in response to the control signal, whereby the respective drive signal output by the shift register is coupled to a corresponding gate line via a turned-on one of the control switches.

Advantageous effects of embodiments of the present disclosure are as follows: by permitting different control switches connected with a shift register to be turned on or off time-divisionally, the shift register may provide a drive signal to gate lines to which the individual control switches are connected. That is, the driving of display pixels may be implemented with less shift registers, thus reducing the footprint occupied by the gate driving circuit.

DETAILED DESCRIPTION

Embodiments of the present disclosure will be described in detail with reference to the drawings. It is to be appreciated that identical or like reference numbers throughout denote identical or similar elements or elements having identical or similar functions. The following embodiments described below with reference to the drawings are exemplary in that they are only used for illustrating the present disclosure, and cannot be construed as limiting the present disclosure.

Figure 1:
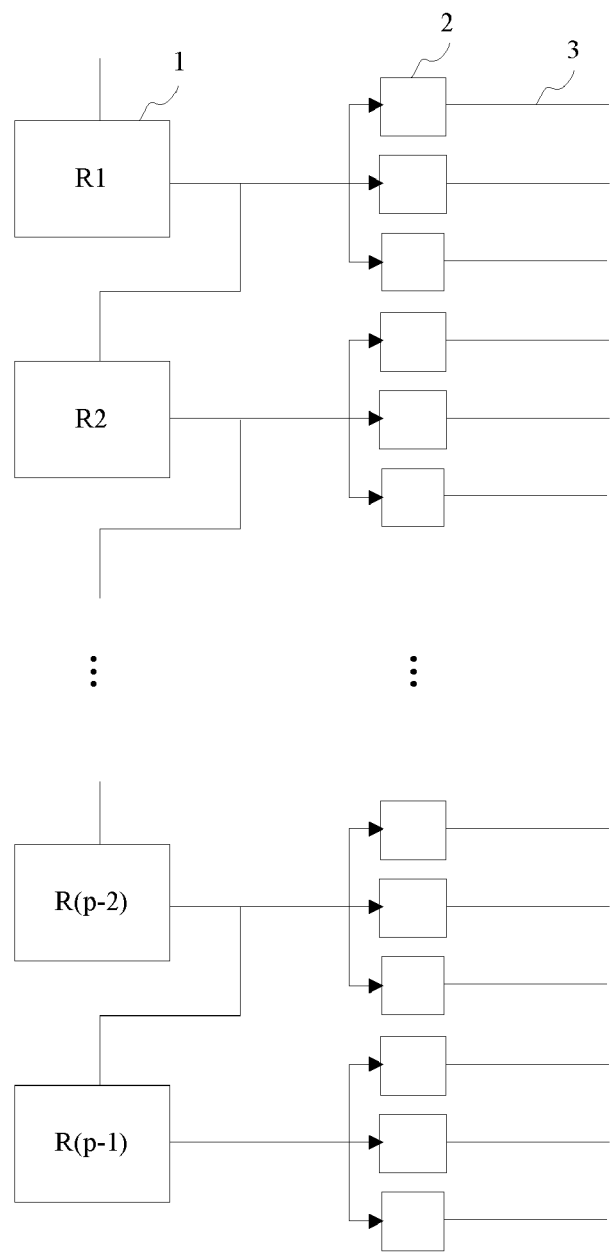
FIG. 1 is a schematic diagram of a gate driving circuit according to an embodiment of the present disclosure.

FIG. 1 is a schematic diagram of a gate driving circuit according to an embodiment of the present disclosure. Referring to FIG. 1, the gate driving circuit includes a plurality of shift registers 1 (shift registers R1, R2, . . . R(p−2), R(p−1) in this figure) and a plurality of control switches 2. An input terminal of each shift register 1 is connected to at least two control switches 2. The control switches 2 are further connected one-to-one with gate lines 3.

As is known, in the gate driving circuit, the plurality of shift registers 1 are cascaded together. Specifically, as shown in FIG. 1, an output terminal of a preceding shift register is coupled to an input terminal of a current shift register, and an output terminal of the current shift register is coupled to an input terminal of a next shift register 1. As such, the plurality of shift registers 1 may output a respective drive signal in turn.

The plurality of control switches 2 are configured such that the control switches connected to the same shift register 1 is turned on and off time-divisionally in response to a control signal. Specifically, when one control switch is turned on, other control switches connected to the same shift register 1 are turned off. In a turned-on state, the control switch 2 couples the drive signal output by the shift register 1 with which it is connected to a corresponding gate line 3. By way of example, and not limitation, the control signal may be provided by a timing controller (not shown).

In this example, the number of the control switches 2 to which each shift register 1 is connected may be equal. Of course, if the total number of the gate lines 3 cannot be exactly divided by the number of the shift registers 1, the number of the control switches 2 to which the last shift register 1 is connected may be smaller than the number of the control switches 2 to which each of other shift registers 1 is connected. Alternatively, the number of the control switches 2 to which the last shift register 1 is connected may still be equal to the number of the control switches 2 to which each of other shift registers 1 is connected, but a portion of the control switches 2 to which the last shift register is connected are not connected to any gate lines 3.

In particular, although each shift register 2 is shown in FIG. 1 as being connected to three control switches 2, other embodiments are also possible. For example, the shift register 1 may be connected to two, four or even more control switches 2, and provides the drive signal to the gate lines 3 through respective control switches 2.

As such, driving of display pixels may be implemented with less shift registers 1, thus reducing the footprint occupied by the gate driving circuit. It is to be appreciated that this also means the display panel is divided into display areas, the number of which is equal to the number of the control switches 3 to which the same shift register 1 is electrically connected. These display area are driven time-divisionally.

To perform time-divisional driving, the plurality of control switches 2 may be divided into a plurality of groups, and the number of the groups is equal to the number of the control switches 2 to which each shift register 1 is connected. Furthermore, the control switches 2 to which the same shift register 1 is connected belong to different groups.

Figure 2:
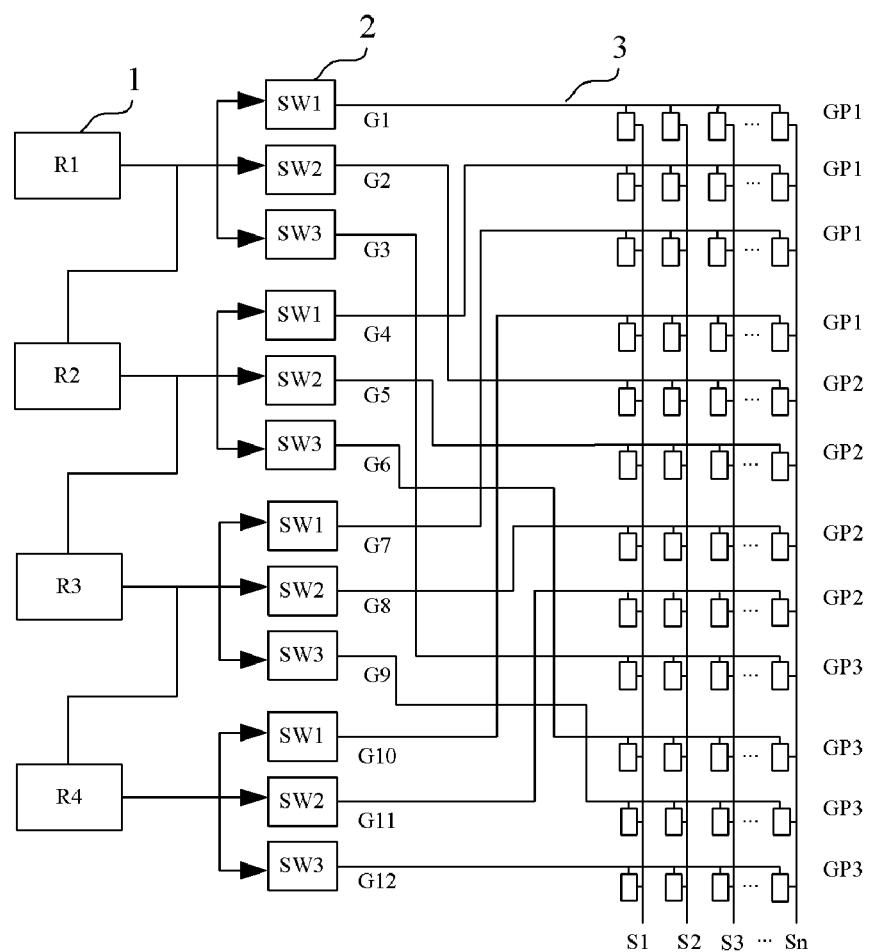
FIG. 2 is a schematic diagram of a connection of a gate driving circuit and gate lines according to an embodiment of the present disclosure.

FIG. 2 is a schematic diagram of a connection of a gate driving circuit and gate lines according to an embodiment of the present disclosure. Without loss of generality, four shift registers R1, R2, R3 and R4, twelve control switches 2, twelve gate lines G1, G2, . . . G12, and a plurality of data lines S1, S2, . . . Sn are shown in FIG. 2. A box located at the intersection of the gate line and the data line represents a pixel.

As shown in the figure, each shift register 1 is connected to three control switches 2, and all the control switches 2 are divided into three groups SW1, SW2 and SW3. Furthermore, the three control switches 2 to which each shift register 1 is connected respectively belong to different groups SW1, SW2 and SW3. In this example, the control switches 2 are connected to the respective gate lines 3 so that gate lines connected to the control switches belonging to the same group are arranged successively. Corresponding to the three control switch groups SW1, SW2 and SW3, all pixels in the display panel are divided into three areas GP1, GP2 and GP3. Each pixel area is provided with a drive signal by a corresponding control switch group. Specifically, the pixel area GP1 is provided with the drive signal by the control switch group SW1, the pixel area GP2 is provided with the drive signal by the control switch group SW2, and the pixel area GP3 is provided with the drive signal by the control switch group SW3.

Illustration will be presented as to how the three pixel areas GP1, GP2 and GP3 are driven time-divisionally in conjunction with FIG. 2.

At a first moment, the shift register R1 outputs a drive signal, and the control switch SW1 is turned on (SW2 and SW3 are turned off), outputting the drive signal on the gate line G1. At a second moment, the shift register R2 outputs a drive signal, and the control switch SW1 is turned on, outputting the drive signal on the gate line G4. At a third moment, the shift register R3 outputs a drive signal, and the control switch SW1 is turned on, outputting the drive signal on the gate line G7. At a fourth moment, the shift register R4 outputs a drive signal, and the control switch SW1 is turned on, outputting the drive signal on the gate line G10. At this time, the driving of the pixel area GP1 ends up.

At a fifth moment, the shift register R1 outputs a drive signal, and the control switch SW2 is turned on (SW1 and SW3 are turned off), outputting the drive signal on the gate line G2. At a sixth moment, the shift register R2 outputs a drive signal, and the control switch SW2 is turned on, outputting the drive signal on the gate line G5. At a seventh moment, the shift register R3 outputs a drive signal, and the control switch SW2 is turned on, outputting the drive signal on the gate line G8. At an eighth moment, the shift register R4 outputs a drive signal, and the control switch SW2 is turned on, outputting the drive signal on the gate line G11. At this time, the driving of the pixel area GP2 ends up.

At a ninth moment, the shift register R1 outputs a drive signal, and the control switch SW3 is turned on (SW1 and SW2 are turned off), outputting the drive signal on the gate line G3. At a tenth moment, the shift register R2 outputs a drive signal, and the control switch SW3 is turned on, outputting the drive signal on the gate line G6. At an eleventh moment, the shift register R3 outputs a drive signal, and the control switch SW3 is turned on, outputting the drive signal on the gate line G9. At a twelfth moment, the shift register R4 outputs a drive signal, and the control switch SW3 is turned on, outputting the drive signal on the gate line G12. At this time, the driving of the pixel area GP3 ends up.

Figure 3:
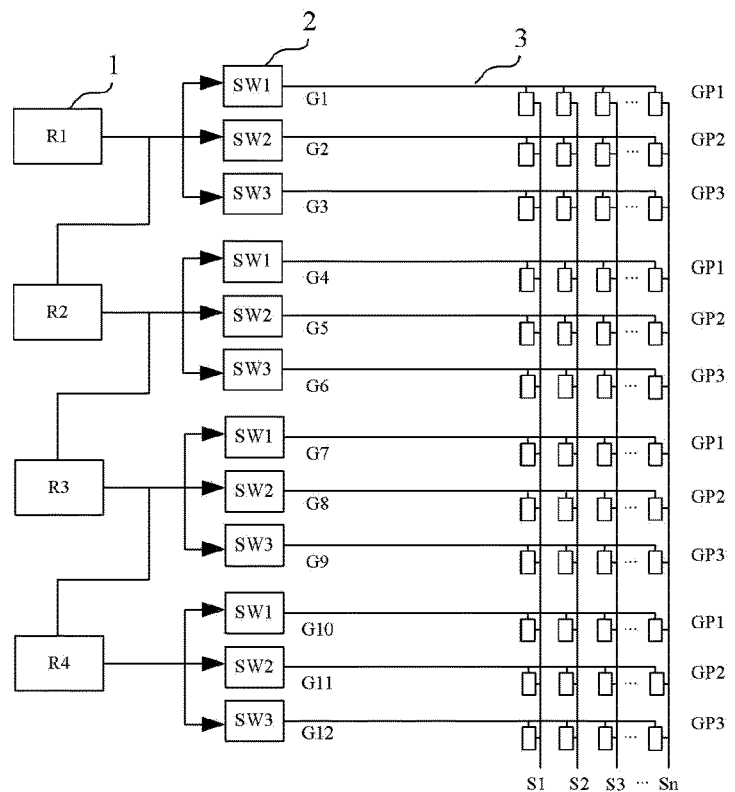
FIG. 3 is a schematic diagram of another connection of a gate driving circuit and gate lines according to an embodiment of the present disclosure.

FIG. 3 is a schematic diagram of another connection of a gate driving circuit and gate lines according to an embodiment of the present disclosure. As shown in the figure, each shift register 1 is connected to three control switches 2, and all control switches 2 are divided into three groups SW1, SW2, and SW3. Furthermore, three control switches 2 to which each shift register 1 is connected respectively belong to different groups SW1, SW2 and SW3.

In this example, the control switches 2 are connected to the gate lines 3 so that the gate lines connected to the control switches belonging to different groups are arranged alternatingly. Corresponding to three control switch groups SW1, SW2 and SW3, all pixels in the display panel are also divided into three areas GP1, GP2 and GP3. In this example, each one of the pixel areas GP1, GP2 and GP3 is not formed by adjacent successive pixel rows, but formed by discrete pixel rows. The time-divisional driving of the pixel areas GP1, GP2 and GP3 is similar to FIG. 2, and will not be detailed here.

It is to be appreciated that the gate driving circuits and their connections with the gate lines as shown in FIG. 2 and FIG. 3 are exemplary, and that there may exist other variants without departing from the scope of the present disclosure. For example, in practice, more gate lines 3 may be included, and therefore more shift registers 1 and control switches 2 may be included.

In embodiments, the control switch 2 may be a thin-film transistor (not shown). The thin-film transistor may be completed using a fabrication process of the array substrate of the display panel, thereby reducing procedures and lowering costs. In an example, a source of the thin-film transistor is electrically connected with the shift register 1, a drain of the thin-film transistor is electrically connected with the gate line 3, and the control signal is provided to a gate of the thin-film transistor.

According to another aspect of the present disclosure, there is further provided an array substrate which includes the above-mentioned gate driving circuit. In an embodiment, the array substrate further comprises a data driver. A gate line driving unit may be integrated in the data driver. The array substrate may further comprise other elements such as pixel electrodes, which is known and therefore not described in detail here.

According to a further aspect of the present disclosure, there is further provided a display panel which includes the above-mentioned array substrate. The display panel may further comprise other elements such as color filter substrate, which is known and therefore not described in detail here.

Figure 4:
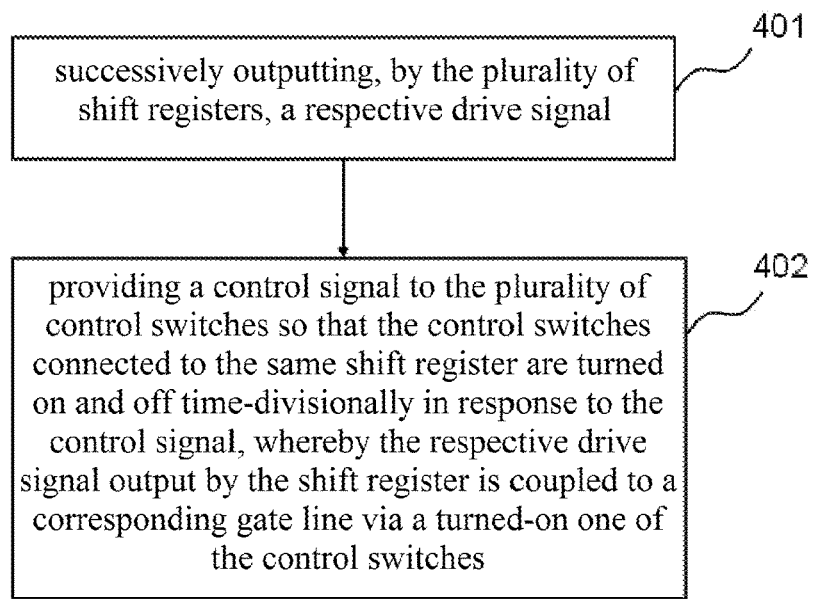
FIG. 4 is a flow chart of performing gate driving using the gate driving circuit as shown in FIG. 1.

FIG. 4 is a flow chart of performing gate driving using the gate driving circuit as shown in FIG. 1. As shown in FIG. 4, at step 401, a plurality of shift registers output a respective drive signal successively. At step 402, the control signal is provided to the plurality of control switches so that the control switches to which the same shift register is connected are turned on and off time-divisionally in response to the control signal, whereby the drive signal output by this shift register is coupled to a corresponding gate line via a turned-on control switch.

Advantageous effects of embodiments of the present disclosure are as follows: by permitting different control switches connected with a shift register to be turned on or off time-divisionally, the shift register may provide a drive signal to gate lines to which the individual control switches are connected. That is, the driving of display pixels may be implemented with less shift registers, thus reducing the footprint occupied by the gate driving circuit.

Apparently, various modifications and variations to the present disclosure may be made by those skilled in the art without departing from the spirit and scope of the present disclosure. Thus, if these modifications and variations of the present disclosure fall within the scope of the appended claims and the equivalents thereof, the present disclosure is also intended to encompass these modifications and variations.

What is claimed is:

1. A gate driving circuit, comprising: a plurality of shift registers cascaded together to successively output a respective drive signals; and a plurality of control switches configured for connection to respective gate lines, wherein each of the plurality of shift registers is connected to at least two respective ones of the plurality of control switches to output a respective one of the drive signals to the at least two respective control switches, wherein the plurality of control switches are configured such that the respective control switches connected to the same shift register are turned on and off time-divisionally in response to a respective control signals, whereby the drive signal output by the same shift register is coupled to a corresponding one of the gate lines via a turned-on one of the respective control switches, wherein each of the plurality of shift registers is connected to an equal number of control switches, wherein the plurality of control switches are divided into a number of groups, the number of the groups being equal to the number of the control switches to which each of the shift registers is connected, wherein the respective control switches to which the same shift register is connected belong to respective different ones of the groups, and wherein the plurality of control switches are configured for connection to the gate lines so that the gate lines connected to the control switches belonging to the same group are arranged successively to supply respective drive signals to successive rows of pixels.

2. The gate driving circuit of claim 1, wherein each of the plurality of control switches is a thin-film transistor.

3. The gate driving circuit of claim 2, wherein a source of the thin-film transistor is electrically connected with a corresponding one of the shift registers, a drain of the thin-film transistor is electrically connected with a respective one of the gate lines, and a gate of the thin-film transistor is configured to receive a respective one of the control signals.

4. An array substrate comprising the gate driving circuit as recited in claim 3.

5. An array substrate comprising the gate driving circuit as recited in claim 2.

6. An array substrate comprising the gate driving circuit as recited in claim 1.

7. The array substrate of claim 6, further comprising a data driver integrated with the gate driving circuit.

8. A display panel comprising the array substrate of claim 6.

9. A method for gate driving using the gate driving circuit as recited in claim 1, comprising: successively outputting, by the plurality of shift registers, a respective drive signals; and providing respective control signals to the plurality of control switches so that the control switches connected to the same shift register are turned on and off time-divisionally in response to respective ones of the control signals, whereby the 3 drive signal output by the same shift register is coupled to a corresponding one of the gate lines via a turned-on one of the respective control switches.

\* \* \* \* \*